(12) United States Patent
Huang et al.

(10) Patent No.: US 10,037,968 B2
(45) Date of Patent: *Jul. 31, 2018

(54) ALIGNMENT SYSTEMS AND WAFER BONDING SYSTEMS AND METHODS

(71) Applicant: Taiwan Semiconductor Manufacturing Company, Ltd., Hsinchu (TW)

(72) Inventors: Xin-Hua Huang, Xihu Township (TW); Xiaomeng Chen, Baoshan Township (TW); Ping-Yin Liu, Yonghe (TW); Lan-Lin Chao, Sindian (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/589,513

(22) Filed: May 8, 2017

(65) Prior Publication Data
US 2017/0243853 A1    Aug. 24, 2017

Related U.S. Application Data

(63) Continuation of application No. 13/963,741, filed on Aug. 9, 2013, now Pat. No. 9,646,860.

(51) Int. Cl.
*H01L 21/68* (2006.01)
*H01L 23/00* (2006.01)
*H01L 21/67* (2006.01)

(52) U.S. Cl.
CPC ........ *H01L 24/94* (2013.01); *H01L 21/67092* (2013.01); *H01L 21/681* (2013.01); *H01L 2224/753* (2013.01)

(58) Field of Classification Search
None
See application file for complete search history.

(56) References Cited

U.S. PATENT DOCUMENTS

| | | | |
|---|---|---|---|
| 4,253,079 A | 2/1981 | Brosh | |
| 7,501,605 B2 | 3/2009 | Steger et al. | |
| 7,682,933 B1* | 3/2010 | Loomis | H01L 25/50 257/E21.122 |
| 7,875,528 B2 | 1/2011 | La Tulipe, Jr. et al. | |
| 8,109,113 B2 | 2/2012 | Takata et al. | |
| 9,109,115 B2 | 8/2015 | Buehler | |
| 2001/0023979 A1 | 9/2001 | Brouvillette et al. | |

(Continued)

OTHER PUBLICATIONS

Balder et al., "Automatic Mask/Wafer Alignment System," IBM Technical Disclosure Bulletin 09-85, Original Publication Date Sep. 1, 1985, pp. 1474-1479.

*Primary Examiner* — Charles Garber
*Assistant Examiner* — Alia Sabur
(74) *Attorney, Agent, or Firm* — Slater Matsil, LLP

(57) ABSTRACT

Alignment systems, and wafer bonding alignment systems and methods are disclosed. In some embodiments, an alignment system for a wafer bonding system includes means for monitoring an alignment of a first wafer and a second wafer, and means for adjusting a position of the second wafer. The alignment system includes means for feeding back a relative position of the first wafer and the second wafer to the means for adjusting the position of the second wafer before and during a bonding process for the first wafer and the second wafer.

20 Claims, 7 Drawing Sheets

(56) References Cited

U.S. PATENT DOCUMENTS

| | | |
|---|---|---|
| 2006/0024920 A1 | 2/2006 | Goto et al. |
| 2006/0138681 A1 | 6/2006 | Best et al. |
| 2006/0141743 A1 | 6/2006 | Best et al. |
| 2006/0141744 A1 | 6/2006 | Best et al. |
| 2006/0201617 A1 | 9/2006 | Hashizume et al. |
| 2007/0028444 A1 | 2/2007 | Kasuga et al. |
| 2008/0062431 A1 | 3/2008 | Goldman |
| 2009/0251699 A1 | 10/2009 | George |
| 2010/0139836 A1 | 6/2010 | Horikoshi |
| 2010/0231928 A1 | 9/2010 | Tanaka et al. |
| 2011/0104870 A1* | 5/2011 | Kobayashi ........ H01L 21/76254 438/458 |
| 2011/0287604 A1 | 11/2011 | Castex et al. |
| 2013/0086786 A1 | 4/2013 | Shih et al. |

* cited by examiner

ALIGNMENT SYSTEMS AND WAFER BONDING SYSTEMS AND METHODS

PRIORITY CLAIM AND CROSS-REFERENCE

This application is a continuation of U.S. patent application Ser. No. 13/963,741, entitled "Alignment Systems and Wafer Bonding Systems and Methods," filed on Aug. 9, 2013, which application is hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

Three dimensional integrated circuits (3DICs) are a recent development in semiconductor packaging in which multiple semiconductor dies are stacked upon one another, such as package-on-package (PoP) and system-in-package (SiP) packaging techniques. 3DICs provide improved integration density and other advantages, such as faster speeds and higher bandwidth, because of decreased length of interconnects between the stacked dies, as examples.

Some methods of forming 3DICs involve bonding together two semiconductor wafers. The wafers may be bonded together using fusion bonding, eutectic bonding, and hybrid bonding, as examples.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

The making and using of some of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Some embodiments of the present disclosure are related to wafer bonding systems and methods for semiconductor wafers that provide improved alignment for bonded wafers. In applications where two patterned or unpatterned silicon or other semiconductor type wafers are bonded using wafer-level bonding, alignment accuracy (AA) is important for device performance and scalability. Novel alignment systems for wafer bonding and novel wafer bonding systems and methods that provide improved AA will be described herein.

Figure 1:
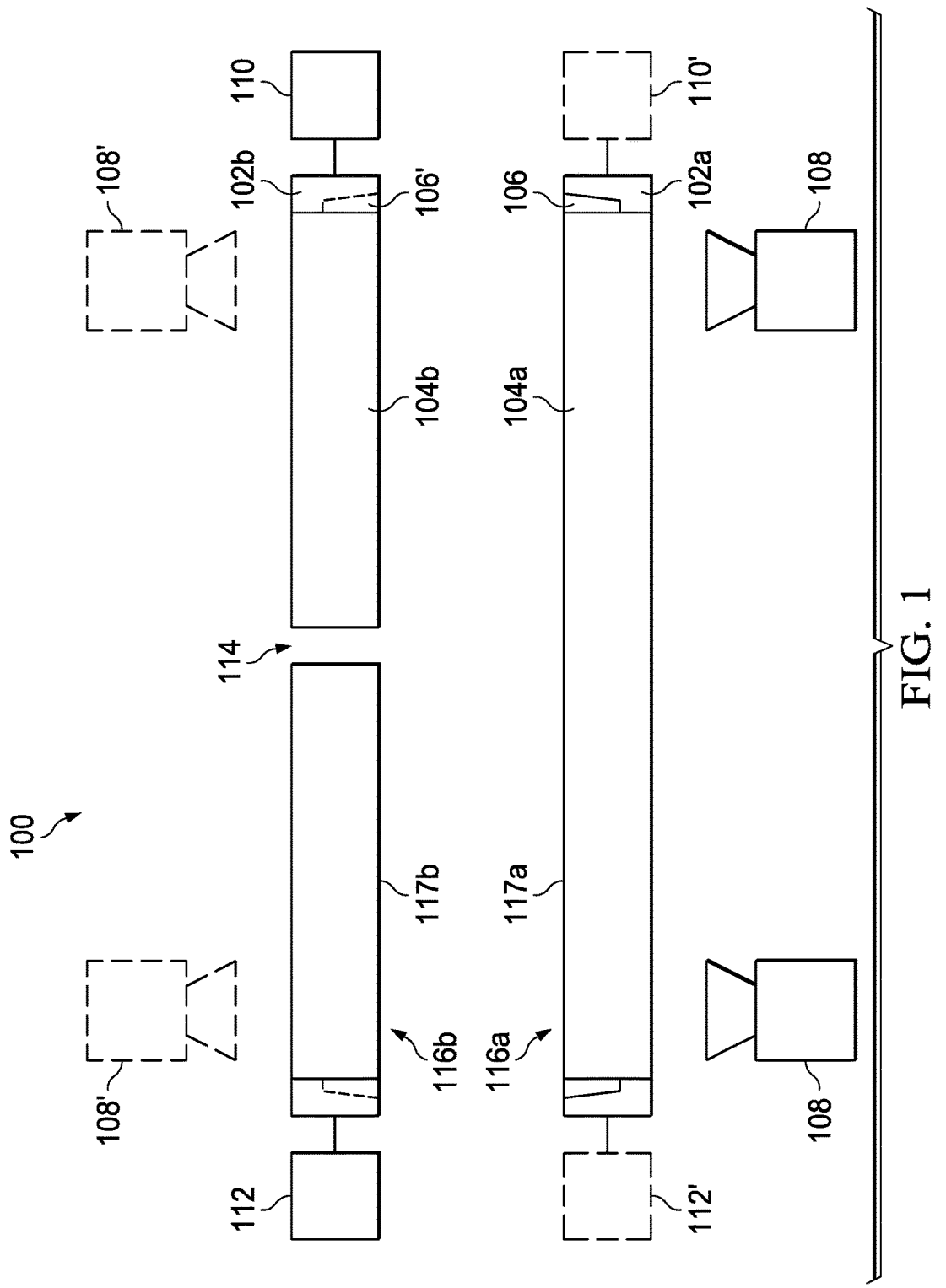
FIG. 1 is a block diagram illustrating a wafer bonding system that includes a novel alignment system in accordance with some embodiments of the present disclosure.

Referring first to FIG. 1, there is shown a block diagram of a wafer bonding system 100 that includes a novel alignment system in accordance with some embodiments of the present disclosure. The alignment system for the wafer bonding system includes a means 108 for monitoring an alignment of a first wafer and a second wafer, a means 110 for adjusting a position of the second wafer, and a means 106 for feeding back a relative position of the first wafer and the second wafer to the means 110 for adjusting the position of the second wafer before and during a bonding process of the first wafer and the second wafer, which will be described further herein.

The wafer bonding system 100 includes a first stage 102a and a second stage 102b. A first chuck 104a is mounted on or attached to the first stage 102a, and a second chuck 104b is mounted on or attached to the second stage 102b. The first stage 102a and the first chuck 104a are also referred to herein collectively as a first support 116a, and the second stage 102b and the second chuck 104b are also referred to herein collectively as a second support 116b. The first chuck 104a is adapted to support a first wafer (not shown in FIG. 1; see first wafer 120a shown in FIG. 3), and the second chuck 104b is adapted to support a second wafer (see second wafer 120b shown in FIG. 3). The first wafer 120a is also referred to herein as a bottom wafer, and the second wafer 120b is also referred to herein as a top wafer. The second chuck 104b includes an aperture 114 formed therein that extends from one side to the other side of the second chuck 104b. The aperture 114 is disposed proximate a substantially central region of the second chuck 104b. The aperture 114 is adapted to accommodate a pin (not shown in FIG. 1; see pin 124 in FIG. 3). During a bonding process for the first wafer and the second wafer, pressure is applicable using the pin 124 to the first wafer or the second wafer. The first chuck 104a and the second chuck 104b also include vacuum holes 119 in some embodiments (not shown in FIG. 1; see FIG. 2).

In some embodiments, the first chuck 104a and the second chuck 104b are substantially transparent. For example, the first chuck 104a and the second chuck 104b may comprise glass, quartz, or other type of transparent material. In other embodiments, the first chuck 104a and the second chuck 104b may comprise a translucent or opaque material. In yet other embodiments, the first chuck 104a is substantially transparent, and the second chuck 104b is translucent or opaque, or vice versa. In embodiments wherein at least the first chuck 104a comprises a substantially transparent material, the alignment of the wafers 120a and 120b is improved due to increased visibility of bond alignment marks on the wafers 120a and 120b.

Figure 2:
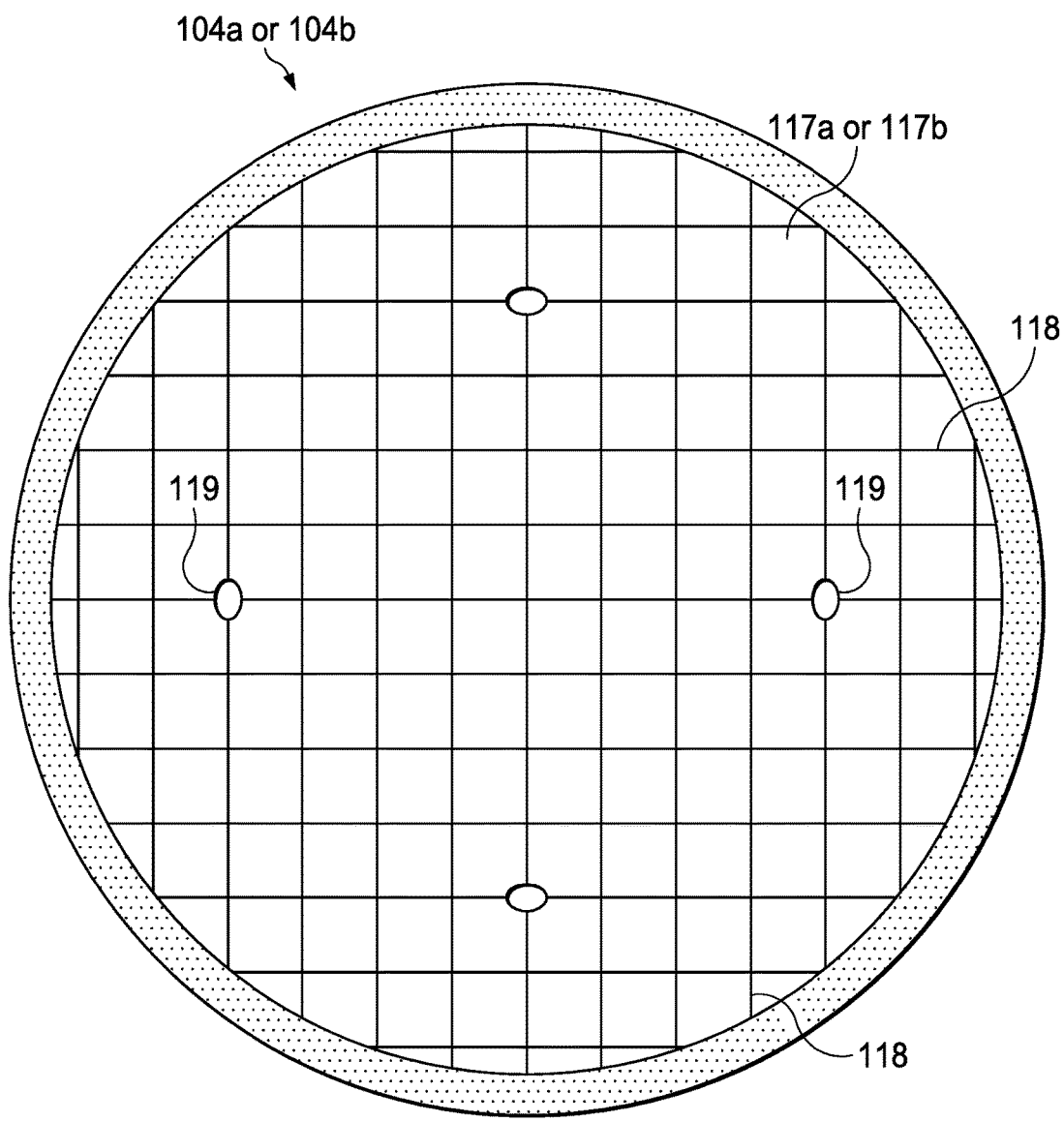
FIG. 2 is a view of a wafer mounting side of a chuck of a support of a wafer bonding system in accordance with some embodiments.

The first chuck 104a and the second chuck 104b include a tessellation pattern disposed thereon in some embodiments. The tessellation pattern is disposed on a wafer mounting side 117a and 117b of the first chuck 104a and the second chuck 104b. FIG. 2 is a view of a wafer mounting side 117a or 117b of a chuck 104a or 104b of a support 116a or 116b of the wafer bonding system 100 shown in FIG. 1 in accordance with some embodiments. The tessellation pattern comprises a plurality of tessellation cuts 118 arranged in an array, such as an "x by y" grid pattern. Alternatively, the tessellation cuts 118 may be arranged in other shapes or patterns. The tessellation pattern comprising the tessellation cuts 118 facilitates an application of a uniform vacuum to the first wafer 120a and the second wafer 120b in some embodiments, for example. The vacuum is used to hold the first wafer 120a and the second wafer 120b in position on the first chuck 104a and the second chuck 104b in some embodiments, for example. The vacuum is applied to the first wafer 120a or the second wafer 120b through vacuum holes 119 that extend through the chuck 104a or 104b, shown in FIG. 2.

Referring again to FIG. 1, in accordance with some embodiments, the means 108 for monitoring the alignment of a first wafer 120a and a second wafer 120b is disposed proximate the first support 116a. In other embodiments, the means 108' for monitoring the alignment of the first wafer 120a and the second wafer 120b is disposed proximate the second support 116b, as shown in phantom (e.g., in dashed lines) in FIG. 1. The means 108 or 108' for monitoring the alignment of a first wafer 120a and a second wafer 120b is also referred to herein, e.g., in some of the claims and in the detailed description, as an alignment monitor module 108. The alignment monitor module 108 comprises an infrared (IR) charge coupled device (CCD) scope in some embodiments, as an example. In some embodiments, the alignment monitor module 108 comprises an IR CCD scope comprising an IR live CCD adapted to emit reflective infrared (RIR) or transparent infrared (TIR) energy, as another example. Alternatively, the alignment monitor module 108 may comprise other types of monitoring and detection equipment.

The means 110 for adjusting a position of the second wafer 120b (or wafer 120a) is coupled to the second support 116b in some embodiments. (Note that in the claims, the reference to terms "first wafer" and/or "second wafer" refers to either the first wafer 120a or the second wafer 120b shown in FIG. 2.) Alternatively, the means 110' may be coupled to the first support 116a in other embodiments, as shown in phantom. The means 110 or 110' for adjusting a position of the second wafer 120b is also referred to herein as a motor 110. A motor 110 may be coupled to each of the first support 116a and second support 116b in some embodiments. One motor 110 may be coupled to both the first support 116a and the second support 116b in other embodiments. The motor 110 comprises a piezoelectric motor or a linear motor in some embodiments. Alternatively, the motor 110 may comprise other types of motors. The motor 110 is adapted to adjust an x position, a y position, a z position, and/or an angular position (θ) of the second wafer 120b (or first wafer 120a) in some embodiments.

The means 106 for feeding back a relative position of the first wafer 120a and the second wafer 120b to the means 110 for adjusting the position of the second wafer 120a before and during a bonding process of the first wafer 120a and the second wafer 120b is coupled to the first stage 102a in some embodiments. In other embodiments, the means 106' for feeding back a relative position of the first wafer 120a and the second wafer 120b to the means 110 for adjusting the position of the second wafer 120a before and during a bonding process of the first wafer 120a and the second wafer 120b is coupled to the second stage 102b, as shown in phantom in FIG. 1. The means 106 or 106' for feeding back a relative position of the first wafer 120a and the second wafer 120b to the means 110 or 110' for adjusting the position of the second wafer 120a or 120b before and during a bonding process of the first wafer 120a and the second wafer 120b is also referred to herein as an alignment feedback module 106. The alignment feedback module 106 comprises a linear variable differential transformer (LVDT), a laser interferometer, or an optical linear encoder and decoder in some embodiments, as examples. Alternatively, the alignment feedback module 106 may comprise other types of instruments that provide positional feedback of the first wafer 120a and/or the second wafer 120b.

The alignment feedback module 106 is in communication with the alignment monitor module 108 and the motor 110 in some embodiments. For example, the alignment feedback module 106 may be electrically coupled to the alignment monitor module 108 and the motor 110, e.g., by wiring in the system 100. In some embodiments, the alignment feedback module 106 or 106' is embedded in the first support 116a or the second support 116b, as illustrated in FIG. 1. In other embodiments, the alignment feedback module 106 or 106' is attached to or coupled to the first support 116a or the second support 116b, not shown.

In some embodiments, the alignment system of the wafer bonding system 100 includes a means 112 for thermally controlling the first wafer 120a or the second wafer 120b. The means 112 for thermally controlling the first wafer 120a or the second wafer 120b may be coupled to the second support 116b, or the means 112' for thermally controlling the first wafer 120a or the second wafer 120b may be coupled to the first support 116a, as shown in phantom in FIG. 1. In embodiments wherein the means 112 for thermally controlling the first wafer 120a or the second wafer 120b is coupled to the second support 116b, the means 112 for thermally controlling is adapted to thermally control the second wafer 120b, as an example. In embodiments wherein the means 112' is coupled to the first support 116a, the means 112' for thermally controlling is adapted to thermally control the first wafer 120a, as another example. In some embodiments, a means 112' for thermally controlling is coupled to the first support 116a, and a means 112 for thermally controlling is also coupled to the second support 116b, as yet another example. The means 112 or 112' for thermally controlling the first wafer 120a or the second wafer 120b is adapted to control a temperature of the first wafer 120a and/or the second wafer 120b to a temperature of about 20 degrees Celsius (C) to about 25 degrees C.+/− about 2.0 degrees C. with about a 0.05 degrees C. resolution, in some embodiments. Alternatively, the means 112 or 112' for thermally controlling is adapted to control wafer temperature at other temperature ranges and tolerances, in other embodiments. In some embodiments, a means 112 and/or 112' for thermally controlling wafer 120a or 120b temperature is not included in the alignment system for the wafer bonding system 100. The means 112 and/or 112' is also referred to herein as a thermal control module 112. The thermal control module 112 comprises a thermal couple or a thermal plate in some embodiments. Alternatively, the thermal control module 112 may comprise other devices or instruments adapted to control wafer 120a and/or 120b temperature. Including the thermal control module 112 in the system 100 and heating the wafers 120a and/or 120b during the bonding process decreases or eliminates intrinsic run-out, i.e., wafer 120a to wafer 120b difference wherein alignment can become worse of bonded wafers from the center to the edge, in some embodiments.

Figure 3:
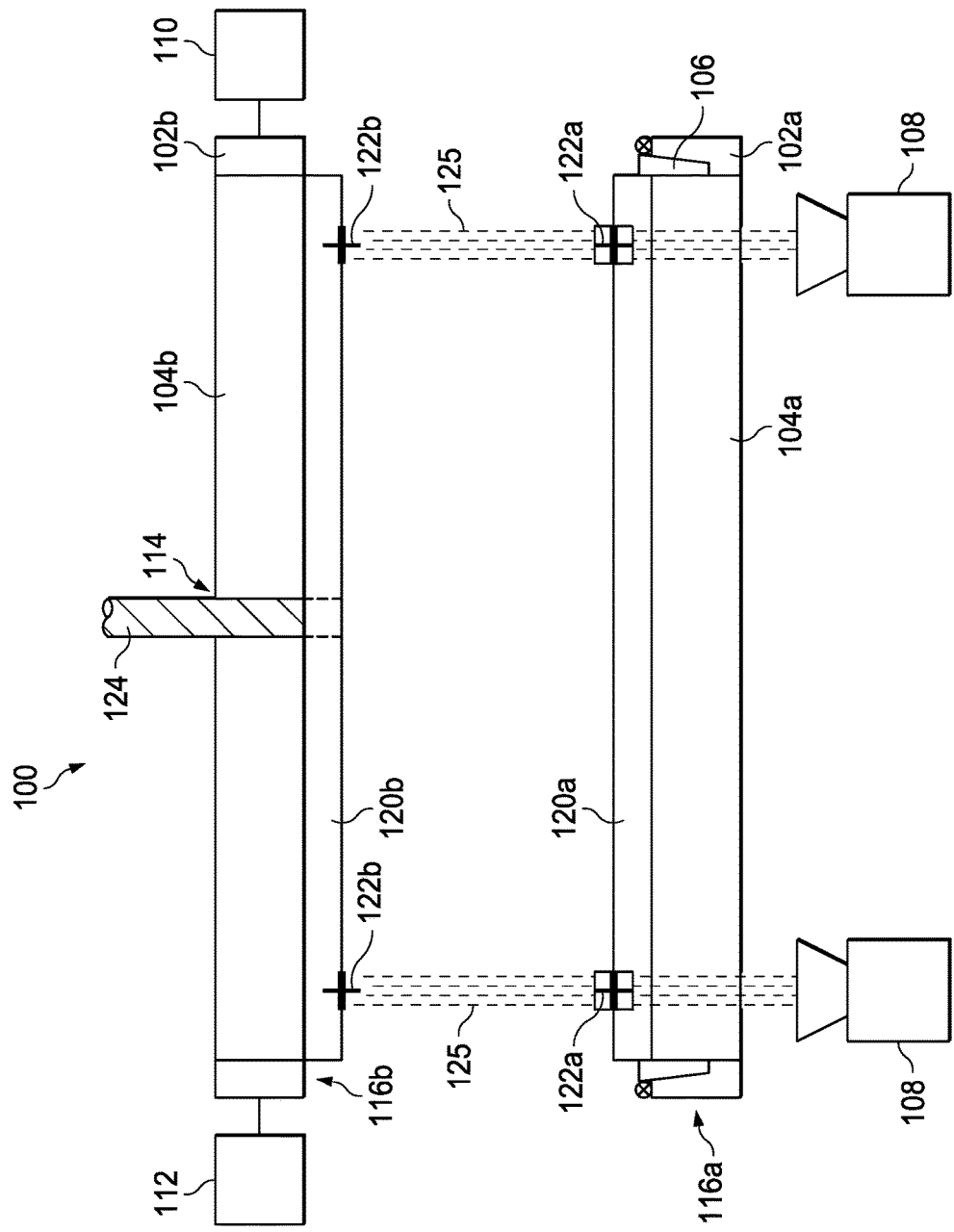
FIGS. 3 through 5 are block diagrams and partial cross-sectional views illustrating a method of bonding wafers together using the wafer bonding system shown in FIG. 1 at various stages of the bonding process in accordance with some embodiments.
Figure 4:
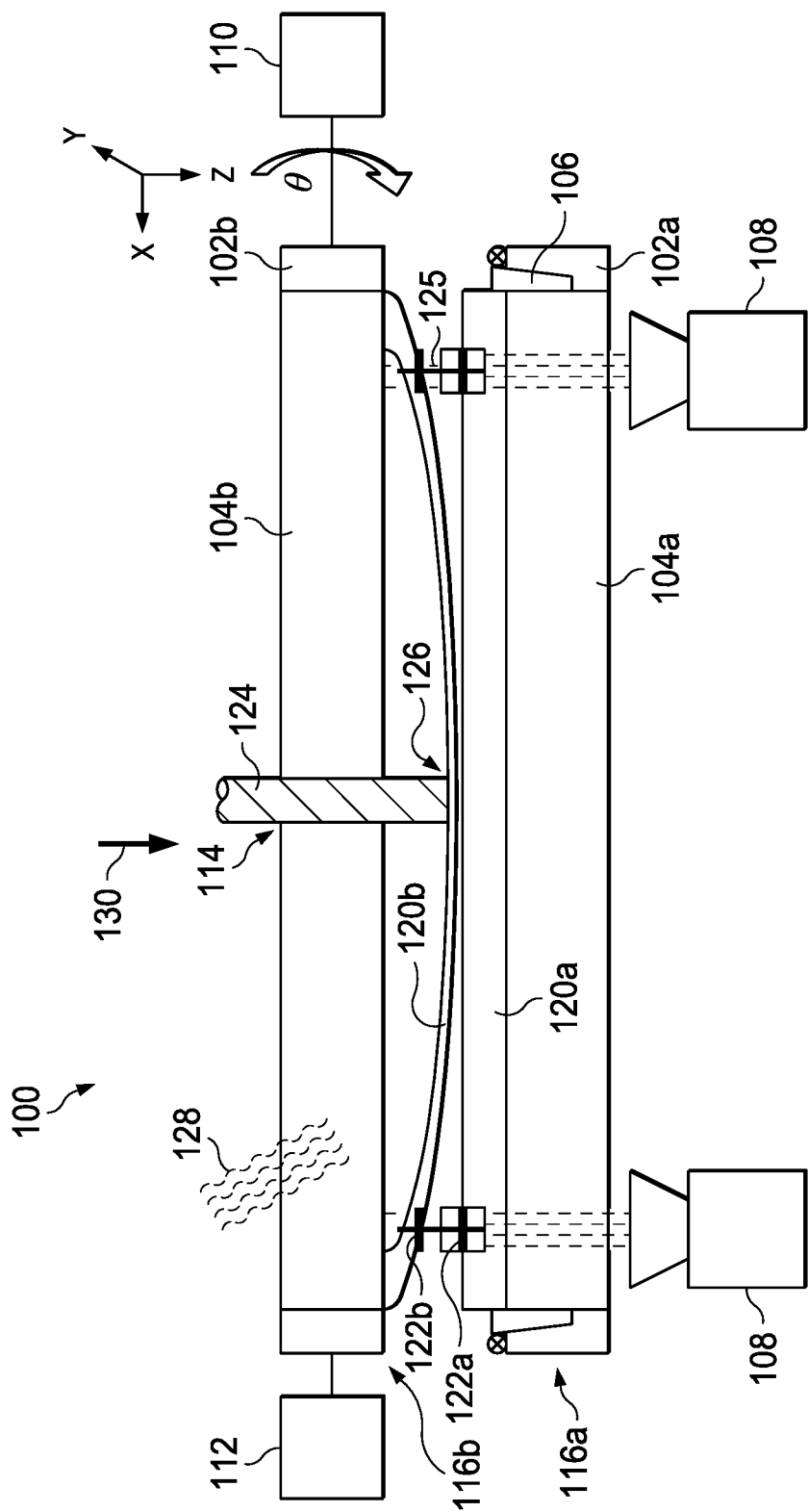
Figure 5:
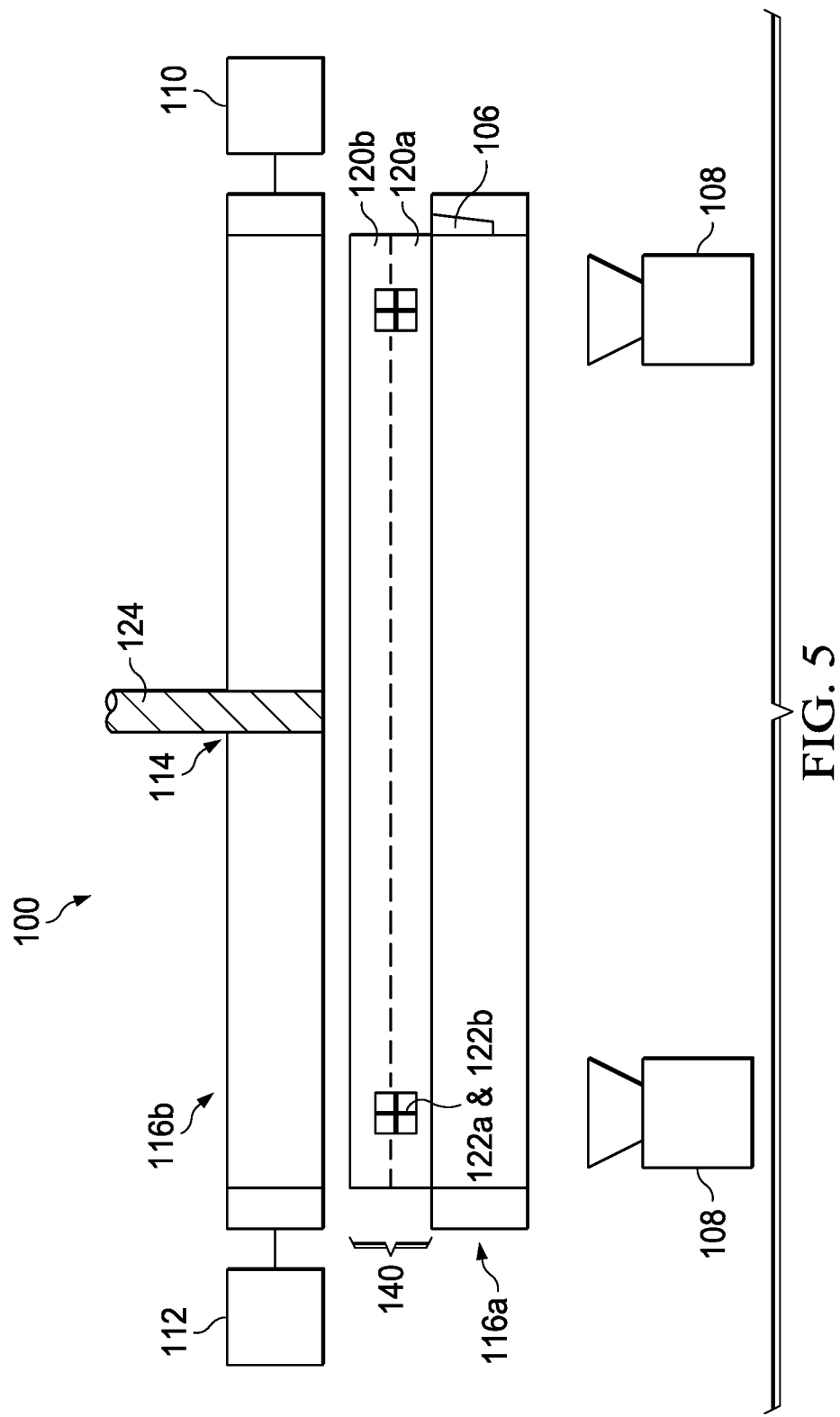

FIGS. 3 through 5 are block diagrams and partial cross-sectional views illustrating a method of bonding wafers 120a and 120b together using the wafer bonding system 100 shown in FIG. 1 at various stages of the bonding process in accordance with some embodiments. In the embodiments shown in FIGS. 3 through 5, the motor 110 and thermal control module 112 are coupled to the second support 116b, the alignment feedback module 106 is coupled to or embedded in the first support 116a, and the alignment monitor module 108 is disposed proximate the first wafer 120a and the first support 116a. Alternatively, the motor 110, thermal control module 112, alignment feedback module 116, and alignment monitor module 108 may be disposed in other locations of the wafer bonding system 100, as shown in FIG. 1.

Before placing the first wafer 120a on the first support 116a and placing the second wafer 120b on the second support 116b, in some embodiments, the wafers 120a and 120b are exposed to a plasma process. The plasma process activates the wafer surface and facilitates the bonding process. In some embodiments, the wafers 120a and 120b are cleaned, after the plasma process. The cleaning process may comprise using cleaning arms, a drain system, and a spin module to keep the wafer surface clean and activated, as examples. A cleaning solvent including deionized (DI) water, acid, and/or alkalinity can be used to remove/protect the bonding surface, for example. Alternatively, other cleaning solvents and processes may be used. The plasma process and/or the cleaning process are not included in the bonding process flow in some embodiments.

The first wafer 120a is placed on or coupled to the first support 116a, and the second wafer is placed on or coupled to the second support 116b. The first wafer 120a and the second wafer 120b may be held onto or retained onto the first support 116a and the second support 116b, respectively, by a vacuum using the vacuum holes 119 shown in FIG. 2, in some embodiments. Other methods or devices may also be used to retain the first wafer 120a and the second wafer 120b onto the first support 116a and the second support 116b. The second support 116b is inverted and disposed over the first support 116a, as shown in FIG. 3. A pin 124 extends through the second chuck 104b through the aperture 114.

The first wafer 120a includes bonding alignment marks 122a formed thereon, and the second wafer 120b includes bonding alignment marks 122b formed thereon. The novel alignment system of embodiments of the present disclosure improves the alignment of the bonding alignment marks 122a and 122b of the first wafer 120a and the second wafer 120b before and during the bonding process for the first wafer 120a and the second wafer 120b.

The alignment monitor module 108, the alignment feedback module 106, and the motor 110 are electrically connected together by wiring in the wafer bonding system 100, not shown. The alignment monitor module 108 is activated to emit IR energy 125 towards and through the chuck 104a, the first wafer 120a, and the bonding alignment marks 122a on the first wafer 120a to the bonding alignment marks 122b on the second wafer 120b. The motor 110 receives the information regarding the location of the bonding alignment marks 122b from the alignment monitor module 108 and adjusts the position of the second wafer 120b relative to the position of the first wafer 120a to perform an initial coarse alignment of the first wafer 120a and the second wafer 120b. The second support 116b is then lowered towards the first support 116a until the second wafer 120b contacts the first wafer 120a, as shown in FIG. 4.

A fine alignment is then performed of the second wafer 120b to the first wafer 120a using the alignment monitor module 108 which continues to emit IR energy 125, the alignment feedback module 106, and the motor 110. Examples of the directions that the motor 110 is adapted to adjust the position of the second wafer 120b are indicated in FIG. 4: an x position (x), a y position (y), a z position (z), and/or an angular position (θ) of the second wafer 120b, in some embodiments.

Pressure is then exerted on a substantially central region of the second wafer 120b using the pin 124 which is lowered through the aperture 114 in the chuck 104b. A force 130 is exerted on the pin 124, creating pressure against the second wafer 120b and causing the second wafer 120b to bend or bow towards the first wafer 120a in some embodiments, as shown by the bowed region 126 of the second wafer 120b in FIG. 4. The amount of the bowing in the bowed region 126 is exaggerated in FIG. 4: the amount of the bowing may not be visually noticeable in some embodiments. The force 130 against the pin 124 causes pressure to be exerted against the second wafer 120b, which pressure is then exerted against the first wafer 120a by the second wafer 120b.

While the pressure is exerted during the bonding process for the first wafer 120a and the second wafer 120b, the fine alignment of the second wafer 120b to the first wafer 120a is continued using the alignment monitor module 108, the alignment feedback module 106, and the motor 110. Continuing to align the second wafer 120b to the first wafer 120a using the alignment monitor module 108, the motor 110, and the alignment feedback module 108 comprises an in-situ and real-time alignment compensation process during the bonding process in some embodiments, for example. The pressure of the pin 124 causes the second wafer 120b to press against the first wafer 120a, facilitating in the bonding process of the first and second wafers 120a and 120b. In some embodiments, the second wafer 120b is pressed against the first wafer 120a using a pressure of about 50 mN to about 1,000 mN for a duration of about 30 seconds to about 120 seconds, as examples. Alternatively, other amounts of pressure and time durations may be used.

In some embodiments wherein the alignment system also includes a thermal control module 112, heat 128 is applied while pressure is applied to the second wafer 120b using the pin 124 using the thermal control module 112, in some embodiments. Applying the heat 128 comprises controlling a temperature of the first wafer 120a or the second wafer 120b to a temperature of about 20 degrees C. to about 25 degrees C.+/− about 2.0 degrees C. with about a 0.05 degrees C. resolution while pressing the second wafer 120b against the first wafer 120a in some embodiments. Alternatively, other temperatures and tolerances for the temperature control may be used. In other embodiments, a thermal control module 112 is not included in the alignment system or wafer bonding system 100, and/or heat 128 is not applied during the bonding process.

After a predetermined time period of applying the pressure and also the heat 128 in some embodiments, the heat 128 is removed and the pin 124 is retracted away from the second wafer 120b, as shown in FIG. 5, which discontinues the pressing of the second wafer 120b against the first wafer 120a. The resulting bonded wafers 140 comprise the first wafer 120a and the second wafer 120b which have been bonded together as a result of the bonding process described herein. Advantageously, alignment of the bonded wafers 140 is improved due the novel in-situ and real-time alignment of the alignment system for the wafer bonding system 100. In some embodiments, the alignment accuracy (AA) of the bonded wafers 140 is measured, after discontinuing pressing the second wafer 120b against the first wafer 120a.

In embodiments wherein at least the first chuck 104a comprises a transparent material, the transparent first chuck 104a intensifies the IR energy 125 resolution. In embodiments wherein the first chuck 104a and second chuck 104b comprise glass or quartz, good transparency is provided for the IR energy to "see" the bonding alignment marks 122a and 122b. The alignment monitor module 108 provides full focus scope of the wafer 120a and 120b bonded pair while aligning two bonding alignment marks 122a and 122b. Simultaneously, the overlapping image of the top wafer 120b and bottom wafer 120a can be transferred to a database for identifying locations of the bonding alignment marks 122a and 122b. The tessellation patterns of the chucks 104a and 104b and use of a vacuum flattens the bonded pair of wafers 120a and 120b, eliminating intrinsic wafer bow.

Leveling of the wafers 120a and 120b is regulated and calibrated by the alignment feedback module 106. The motor 110 stages to an exact position according to the database from the alignment monitor module 108 and the alignment feedback module 106. Course alignment is achieved by identifying the bonding alignment marks 122a and 122b using the alignment monitor module 108. After the "pin-down" or application of the force 130 onto the pin 124, the alignment feedback module 106 and alignment monitor module 108 also achieve fine alignment to further improve AA. In embodiments wherein the alignment feedback module 106 comprises an LVDT, three points may be contacted in real time, feeding back the position and leveling of both the top wafer 120b and the bottom wafer 120a, for example.

The temperature control module 112 regulates the second chuck 104b and wafer 120b to decrease or eliminate run-out. After the two wafers 120a and 120b and the pin-down, the temperature control module 112 manipulates the temperature to compensate the intrinsic run-out for wafer to wafer difference in order to eliminate the wafer edge shift. The thermal control module 112 compensates the run-out of incoming wafer/hardware induced, by manipulating the thermal difference of the two chucks 104a and 104b.

Figure 6:
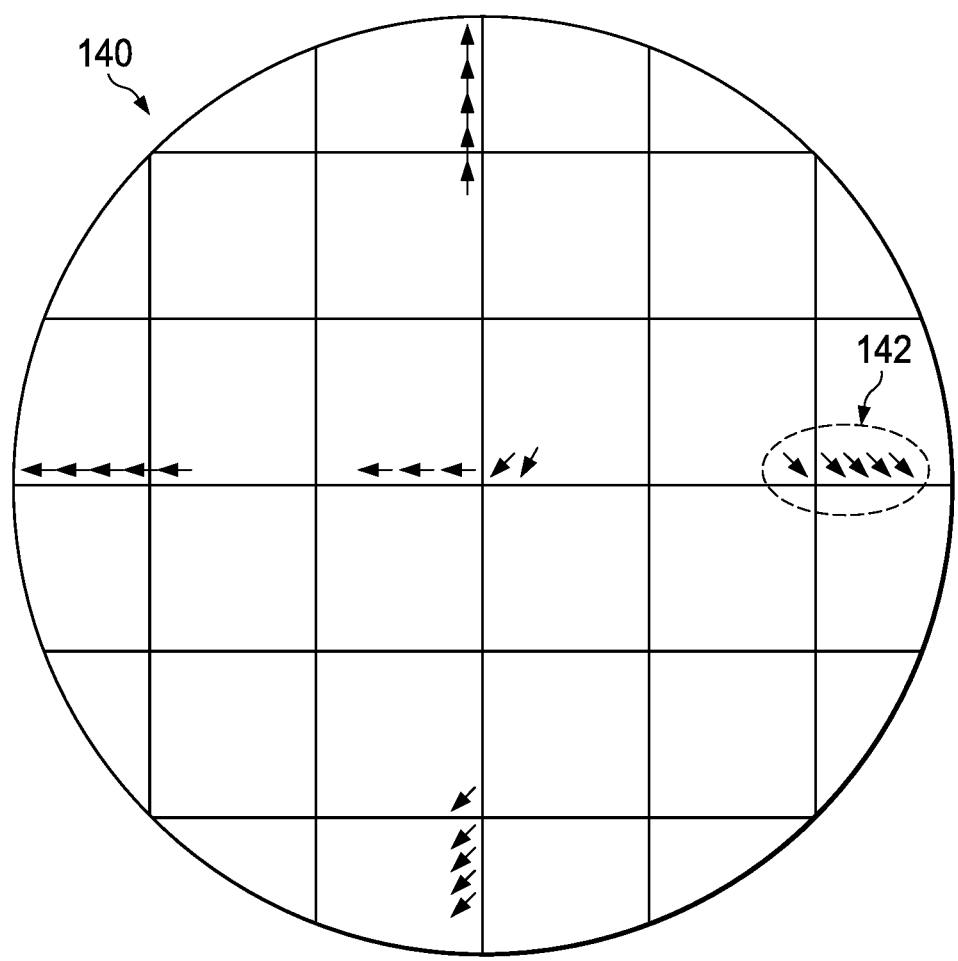
FIG. 6 shows a top view of bonded wafers that have been bonded using the wafer bonding system shown in FIGS. 1 and 3 through 5, illustrating improved alignment accuracy (AA) achieved in accordance with some embodiments.

FIG. 6 shows a top view of bonded wafers 140 that have been bonded using the wafer bonding system 100 shown in FIGS. 1 and 3 through 5, illustrating improved AA achieved for the bonded wafers 140 in accordance with some embodiments. The AA markers 142 indicate the improved alignment of the bonded wafers 140.

Figure 7:
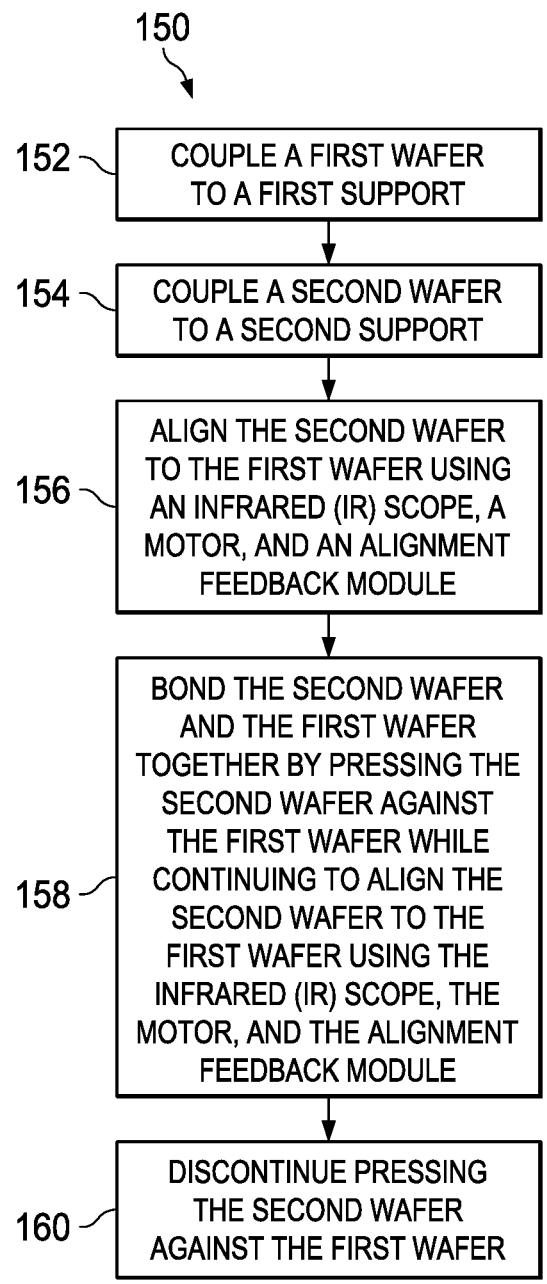
FIG. 7 is a flow chart of a method of bonding wafers in accordance with some embodiments.

FIG. 7 is a flow chart 150 of a method of bonding wafers in accordance with some embodiments. In step 152, a first wafer 120a is coupled to a first support 116a (see also FIG. 3). In step 154, a second wafer 120b is coupled to a second support 116b. In step 156, the second wafer 120b is aligned to the first wafer 120a using an IR scope 108, a motor 110, and an alignment feedback module 106 (see FIGS. 3 and 4). In step 158, the second wafer 120b and the first wafer 120a are bonded together by pressing the second wafer 120b against the first wafer 120a while continuing to align the second wafer 120b to the first wafer 120a using the IR scope 108, the motor 110, and the alignment feedback module 106 (see FIG. 4). In step 160, pressing the second wafer 120b against the first wafer 120a is discontinued (see FIG. 5).

Some embodiments of the present disclosure include alignment systems for wafer bonding systems. Other embodiments include wafer bonding systems that include the novel alignment systems. Some embodiments of the present disclosure also include methods of bonding wafers, and bonded wafers that have been bonded using the novel bonding methods, alignment systems, and wafer bonding systems described herein. The wafer bonding systems are adapted to bond the first wafer 120a and the second wafer 120b together using fusion bonding, eutectic bonding, hybrid bonding, or other types of semiconductor wafer bonding, for example.

Advantages of some embodiments of the present disclosure include providing alignment systems that improve alignment of bonded wafers 140. An alignment feedback module 106 comprising an LVDT and an alignment monitor module 108 comprising an IR scope are integrated with a wafer bonding system 100 for the detection of wafer 120a and 120b bond pair position and bond wave propagation, in some embodiments. A motor 110 comprising a piezoelectric monitor and a thermal control module 112 are integrated with a chuck 104b for separate movement and temperature control of the wafer 120a and 120b bond pair, in some embodiments. The implementation of these features in a wafer bonding system 100 provides a closed-loop control mechanism that positions the wafer 120a and 120b bond pair to align together through the entire duration of the wafer bonding procedure. A minimal alignment shift of about 0.2 µm or less, for example, is advantageously achievable in some applications.

Due to the improved alignment, re-work of bonded wafers, which can be troublesome and time-consuming, is reduced or eliminated. Uncertainty of the alignment of the wafers 120a and 120b is decreased or eliminated, by eliminating "blind spots" in the bonding process. The bonded wafers 140 have improved edge alignment quality, and more accurate alignment.

Furthermore, the formation of seams between the two wafers 120a and 120b is prevented, and the bonded wafers 140 have improved bonding strength. The formation of interfaces between metal to metal bonds is reduced or prevented, resulting in improved electrical connections and conductivity, and decreased reliability issues.

Some embodiments provide a real-time correction of the shift of the wafers 120a and 120b using an IR scope, LVDT, and a motor having a fine movement system. Real-time observation of alignment shifts in an x, y, z, and θ is provided. The thermal control module 112 compensates for the difference of incoming wafers to reduce or eliminate shift at the wafer edge; for example, wafer bow can be compensated for using chuck temperature control. The real-time correction of alignment shifts results in preventing a requirement of re-work of bonded wafers caused by misalignment.

In embodiments wherein the chuck(s) comprises glass or quartz, visibility of the IR scope is advantageously improved. The in-situ real time alignment system in which an LVDT an IR scope are combined provides absolute position of both the wafers and chucks, in some embodiments. A piezoelectric motor corrects the x, y, z, and θ direction by fine movement, in some embodiments. In addition, the novel alignment systems and methods are easily implementable in wafer bonding systems and process flows.

In accordance with some embodiments of the present disclosure, an alignment system for a wafer bonding system includes means for monitoring an alignment of a first wafer and a second wafer, and means for adjusting a position of the second wafer. The alignment system includes means for feeding back a relative position of the first wafer and the second wafer to the means for adjusting the position of the second wafer before and during a bonding process for the first wafer and the second wafer.

In accordance with other embodiments, a wafer bonding system includes a first support for a first wafer and a second support for a second wafer. The system includes an alignment monitor module proximate the first support or the second support, and a motor coupled to the first support or the second support. An alignment feedback module is coupled to the first support or the second support and in communication with the alignment monitor module and the motor. A thermal control module is coupled to the first support or the second support.

In accordance with other embodiments, a method of bonding wafers includes coupling a first wafer to a first support, and coupling a second wafer to a second support. The second wafer is aligned to the first wafer using an IR scope, a motor, and an alignment feedback module. The method includes bonding the second wafer and the first wafer together by pressing the second wafer against the first wafer while continuing to align the second wafer to the first wafer using the IR scope, the motor, and the alignment feedback module. Pressing the second wafer against the first wafer is then discontinued.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
    aligning a first wafer to a second wafer with a first alignment process, the first wafer being on a first stage and the second wafer being on second stage, the first alignment process utilizing an infrared charge coupled device to determine locations of a plurality of alignment marks;
    moving the second stage towards the first stage until a middle portion of a front side of the second wafer makes physical contact with a front side of the first wafer, the middle portion of the front side of the second wafer protruding toward the first wafer by a pin pressed against a middle portion of a back side of the second wafer;
    after physical contact, aligning the second wafer to the first wafer with a second alignment process, the second alignment process using the infrared charge coupled device and a linear variable differential transformer; and
    after the second alignment process, further moving the second stage towards the first stage until an outer portion of the front side of the second wafer makes contact with an outer portion of the front side of the first wafer, the infrared charge coupled device and the linear variable differential transformer continuing to align the second wafer to the first wafer.

2. The method of claim 1 further comprising:
    discontinuing the moving of the second wafer when the second wafer is bonded to the first wafer.

3. The method of claim 1, wherein the plurality of alignment marks is on at least one of the first and second wafers.

4. The method of claim 1, wherein the plurality of alignment marks is on both the first and second wafers.

5. The method of claim 1 further comprising:
    thermally controlling the first wafer.

6. The method of claim 1 further comprising:
    cleaning the first wafer and the second wafer, before placing the first wafer on the first stage and placing the second wafer on the second stage.

7. The method according to claim 6 further comprising:
    exposing the first wafer and the second wafer to a plasma process, before cleaning the first wafer and the second wafer.

8. A wafer bonding system comprising:
    a first wafer stage having a first wafer mounting side for supporting a first wafer, and a first backside opposite the first wafer mounting side;
    a second wafer stage having a second wafer mounting side for supporting a second wafer, and a second backside opposite the second wafer mounting side;
    an infrared charge coupled device proximate the first backside of the first wafer stage, the infrared charge coupled device configured to emit infrared energy towards and through the first wafer stage and first wafer when the second wafer approaches the first wafer and when the second wafer makes contact and begins bonding with the first wafer;
    a motor coupled to the second wafer stage; and
    a linear variable displacement transformer coupled to the first wafer stage and in communication with the infrared charge coupled device and the motor, the linear variable displacement transformer configured to communicate with the infrared charge coupled device and the motor when the second wafer approaches the first wafer and when the second wafer makes contact with the first wafer.

9. The wafer bonding system of claim 8, wherein the linear variable displacement transformer is at least partially embedded in the first wafer stage.

10. The wafer bonding system of claim 8 further comprising:
    a thermal control module coupled to the first wafer stage.

11. The wafer bonding system of claim 8 further comprising:
    a first wafer chuck attached to the first wafer stage.

12. The wafer bonding system of claim 11, wherein the first wafer chuck is substantially transparent.

13. The wafer bonding system of claim 11, wherein a surface of the first wafer chuck includes a plurality of cuts in a tessellation pattern.

14. The wafer bonding system of claim 8 further comprising:
a second wafer chuck attached to the second wafer stage, the second wafer chuck including an aperture proximate a central region of the second wafer chuck and a pin disposed within the aperture, wherein during a bonding process for the first wafer and the second wafer, pressure is applicable using the pin to the second wafer.

15. The wafer bonding system of claim 8, wherein the motor comprises a linear motor.

16. A method comprising:
aligning a second wafer to a first wafer by using an infrared scope to determine first locations of a first alignment mark on the first wafer and a second alignment mark on the second wafer using the infrared scope and using a motor to adjust a first position of the second wafer;
moving the second wafer in the direction toward the first wafer using the motor until a portion of the second wafer contacts the first wafer;
after contact, determining a relative position of the first wafer and the second wafer using a linear variable displacement transformer;
after contact, determining second locations of the first alignment mark on the first wafer and the second alignment mark on the second wafer using the infrared scope;
aligning the second wafer to the first wafer by adjusting a second position of the second wafer using the motor based on the determined second locations of the first alignment mark and the second alignment mark by the infrared scope and on the determined relative position of the first wafer and the second wafer by the linear variable displacement transformer; and
bonding the second wafer and the first wafer together by pressing the second wafer against the first wafer while continuing to align the second wafer to the first wafer using the infrared scope, the motor, and the linear variable displacement transformer.

17. The method of claim 16 further comprising:
before contact, pressing an inner portion of the second wafer in a direction toward the first wafer using a pin, during the pressing, the pin contacting a surface of the second wafer opposite the first wafer.

18. The method of claim 16, wherein pressing the second wafer against the first wafer comprises using a pressure of 50 mN to 1,000 mN for a duration of 30 seconds to 120 seconds.

19. The method of claim 16, further comprising controlling a temperature of the first wafer or the second wafer to a temperature of 20 degrees Celsius (C) to 25 degrees C.+/−2.0 degrees C. with a 0.05 degrees C. resolution while pressing the second wafer against the first wafer.

20. The method of claim 16 further comprising:
cleaning the first wafer and the second wafer; and
after cleaning and before aligning, placing the first wafer on a first stage and placing the second wafer on a second stage.

* * * * *